United States Patent [19]

Kasten et al.

[11] Patent Number: 5,276,399
[45] Date of Patent: Jan. 4, 1994

[54] MAGNET SYSTEM WITH SUPERCONDUCTING FIELD COILS

[75] Inventors: Arne Kasten; Wolfgang Hans-Georg Müller, both of Karlsruhe, Fed. Rep. of Germany

[73] Assignee: Bruker Analytische Messtechnik GmbH, Fed. Rep. of Germany

[21] Appl. No.: 775,980
[22] PCT Filed: Apr. 25, 1990
[86] PCT No.: PCT/DE90/00300
§ 371 Date: Oct. 28, 1991
§ 102(e) Date: Oct. 28, 1991
[87] PCT Pub. No.: WO90/13824
PCT Pub. Date: Nov. 15, 1990

[30] Foreign Application Priority Data

Apr. 29, 1989 [DE] Fed. Rep. of Germany ....... 3914243

[51] Int. Cl.$^5$ .................................................. G01V 3/00
[52] U.S. Cl. .................................. 324/319; 324/320; 335/216
[58] Field of Search ............... 324/300, 318, 319, 320, 324/322; 335/216, 299, 296

[56] References Cited

U.S. PATENT DOCUMENTS

| | | | |
|---|---|---|---|
| 4,385,277 | 5/1983 | Hanley | 324/319 |
| 4,587,504 | 5/1986 | Brown et al. | 335/216 |
| 4,724,412 | 2/1988 | Kalafala | 335/299 |
| 4,799,017 | 1/1989 | Siebold et al. | 324/319 |

FOREIGN PATENT DOCUMENTS

| | | |
|---|---|---|
| 0138270 | 4/1985 | European Pat. Off. . |
| 0144171 | 6/1985 | European Pat. Off. . |
| 0167243 | 1/1986 | European Pat. Off. . |
| 3829175 | 3/1989 | Fed. Rep. of Germany . |
| 2205444 | 12/1988 | United Kingdom . |
| 2206242 | 12/1988 | United Kingdom . |

OTHER PUBLICATIONS

Review of Scientific Instruments, 56 (1985) Mar., No. 3, New York, USA, pp. 402–410.
Rath et al.: "Opposed coil magnet calculations for large samples and unilateral nuclear-magnet resonance" Rev. Sci. Inst. vol. IEEE Transactions on Magnetics, vol. MAG-23 (1987) Mar., No. 2, New York, N.Y., USA, pp. 1299 α 1302.
Green et al.: "A 4.7 tesla magnet for magnetic resonance imaging and spectroscopy".

Primary Examiner—Louis Arana
Attorney, Agent, or Firm—Walter A. Hackler

[57] ABSTRACT

In a magnet system with two coil systems of different mean diameter arranged coaxially with respect to the longitudinal axis of the system defined by the direction of the field in the homogeneity region, which are rotationally symmetrical and are arranged symmetrically about the transverse median plane of the system perpendicular to the longitudinal axis and can carry exciting currents which result in overlapping magnetic fields that compensate, at least approximately, for the dipole fields of the two coil systems, an operating mode selector switch device (22) configured as a superconducting network is provided, by means of which the magnet system (10) can also be switched, as an alternative to the operating mode which provides considerable dipole-field compensation in the outer space of the magnet system (10), to that operating mode in which the magnetic fields generated by the two coil systems (11 and 12) at the center thereof are aligned in the same direction. In a special configuration, the ratio $B_{0i}:B_{0a}$ between the values of the field strengths $B_0 1$ and $B_a$ generated by the inner field coil (11) and the outer field coil (12) is equal to 3.

20 Claims, 8 Drawing Sheets

MAGNET SYSTEM WITH SUPERCONDUCTING FIELD COILS

BACKGROUND OF THE INVENTION

The invention relates to a magnet system with superconducting field coils for generating a constant magnetic field, suitable for NMR experiments, which has a high field strength in the experimental volume and sufficient homogeneity for NMR tomographic and/or spectroscopic experiments.

Such magnet systems, which have two coil systems of different mean diameters arranged coaxially with respect to the longitudinal axis defined by the field direction in the homogeneity region, which are rotationally symmetrical and are arranged symmetrically about the transverse median plane perpendicular to the longitudinal axis, and which can be excited with currents which generate magnetic fields that compensate, at least approximately, for the dipole fields of the two coil systems in the outer space of the magnet system, are known (for example from EP 0 138 270 A2, EP0 144 171 A1, DE 38 29 175 A1, and GB 2 206 242 A).

In the magnet system disclosed by EP 0 144 171 A1, the field coils whose (dipole) fields are intended to be largely compensated for in the outer space of the magnet system are permanently wired in series. In the magnet system disclosed by DE 38 29 175 A1, parallel wiring of the field coils which develop the two oppositely aligned magnetic moments is also disclosed as an alternative to series connection thereof. Although these known systems can be operated with currents of varying intensities without thereby significantly impairing the shielding effect in the outer space, the usable field strengths are nevertheless limited, by the fact that the magnetic field generated by the outer field coil is always aligned opposite to the magnetic field generated by the inner field coil, to a value that is less than the absolute field strength of the magnetic field generated by the inner field coil.

In contrast, the magnet systems of the aforesaid kind disclosed by EP 0 138 270 A2 and GB 2 206 242 A are configured in such a way that the two superconducting field coils can be energized with currents of different strengths, with at least one of the two field coils being energized inductively, and the two field coils each forming a self-contained current circuit. Depending on the current strength value to which the shield—i.e., outer—field coil is energized, it is then possible to vary the field strength that can be utilized for an experiment between a minimum value—which results when the outer, shielding field coil is energized to a maximum value for its operating current strength (assuming a predetermined charge of the inner field coil)—and a maximum value which results when the outer, shielding field coil is not energized.

The magnetic field strengths in the experimental volume that can be utilized with known magnet systems (i.e., those having active shielding provided by an external field coil in the outside space) are therefore two low for many experimental purposes, so that the known magnet systems appear to be suitable, at best, for tomographic experiments in which the primary requirement is good field homogeneity in the largest possible experimental volume, while high field strength is not of critical importance. However, the known magnet systems are therefore unsuitable for investigative purposes such as NMR spectroscopy experiments, in which less emphasis is placed on good homogeneity of the magnetic field in the largest possible experimental volume at moderate field strength, while the highest possible field strength—along with good field homogeneity in a relatively small experimental volume—is important.

SUMMARY OF THE INVENTION

The object of the invention is therefore to improve a magnet system of the aforesaid kind in such a way that even with a simple configuration it is equally suitable both for NMR tomography and for spectrographic purposes, such as for example scientific analysis experiments.

This object is achieved, according to the invention, by the fact that an operating mode selector switch device is provided, by means of which the magnet system can also be switched, as an alternative to the operating mode which provides considerable dipole-field compensation in the outer space of the magnet system, to at least that operating mode in which the magnetic fields generated by the two coil systems at the center thereof are aligned in the same direction.

The magnet system according to the invention has the advantage, from the user's point of view, that it offers the option of two different utilization possibilities: on the one hand a shielding mode at relatively low field strength but with a large homogeneity volume; and on the other hand a high-field mode which allows the use of substantially higher magnetic field strengths in a relatively smaller experimental volume but with good homogeneity; in this respect the magnet system according to the invention appears primarily suitable for research purposes where, in general, a wider range of variation in experimental boundary conditions is required than in the medical diagnostic field, for example whole-body tomography, for which the magnet system according to the invention—when set to shielding mode—is equally well suited.

From a manufacturer's point of view, it may be regarded as a noteworthy advantage that one and the same magnet system can be offered for a corresponding variety of applications, which can lead to both a considerable gain in manufacturing efficiency and to an improvement in delivery availability, together with a reduction in minimum inventories.

When the ratio between the value of the field strength of the magnetic field generated by the inner field coil of the magnet system and the value of the field strength of the field generated by the outer field coil of the magnet system is equal to around 3:1, it is possible, with the magnet system in high-field mode, to obtain a magnetic field that is twice as great in terms of value as in the shielding mode of the magnet system.

In one embodiment, two field coils are utilized with each coil generating fields of good homogeneity, the superposition of which, regardless of whether currents of the same or different strengths are flowing through the two field coils, again results in a magnetic field whose homogeneity corresponds at least to the "lower" of the homogeneity values of the two field coils.

Other embodiments of the present invention are suitable for application in a whole-body tomograph, and generates a field strength at the center of 1 T in shielding mode, and 2 T in high-field mode.

The series connection of the two field coils of the magnet system is advantageous for reasons associated with the quench resistance of the superconducting magnet system.

The operating mode selector switch device, by means of which the magnet system can be set to the particular desired operating mode—shielding mode or high-field mode—prior to creation of the superconducting current (energization), can be implemented as a simple multiple-pole mechanical switch, although in this case a permanent connection of the coil system to the electrical energizing unit is necessary.

This disadvantage can easily be eliminated by using as the operating mode selector switch device a superconducting network according to the present invention, which can easily be implemented. Such a network also means that if one of the two field coils of the magnet system fails, for example because of a winding breakage, the other field coil can be re-energized and used independently to generate a magnetic field with a restricted homogeneity region.

Since different forces act on the windings of the magnet system according to the invention in its two possible operating modes, and these also lead to correspondingly different, albeit only negligible, deformations of the coil elements supporting the field coils and their windings, which also results in differing effects on field homogeneity, it is advantageous if the magnet system is also provided with a well-equipped shim system, with which field inhomogeneities resulting from slight shifts in the subcoils of the field coils can be compensated for.

In accordance with the present invention a shim system may be provided that is suitable in this regard, usable alternatively or in combination.

In order to achieve minimum external shielding of the magnet system for the high-field mode, and, for example, for instances in which only one of the two field coils is being utilized or is available for operation, an iron shield can additionally be provided. The influence of such an iron shield on field strength and homogeneity can be taken into account for each of the two operating modes when designing the magnet system (cf. H. Brechna, "Superconducting Magnet Systems," Technische Physik in Einzeldarstellungen, Volume 18, Springer-Verlag Berlin, Heidelberg, New York, L.F. Bergmann Verlag, Munich, 1973).

In the interest of compactness and also for design reasons it is especially advantageous if such an iron shield, which can consist in a known manner of end plates and beam-shaped shielding elements connecting them together, is arranged so that it directly surrounds the cryostat which contains the magnet system.

Since an iron shield also influences the field contour inside the magnet system, it is especially advantageous if the iron shield, in the interest of maintaining the best possible field homogeneity inside the magnet system, can be adapted to the various possible operating modes of the magnet system.

The magnet system according to the invention is especially suitable for mobile systems, which are taken from hospital to hospital on a shared or loan basis, and can generate a field (i.e., be energized) at each place after being set to the required operating mode.

In such a configuration of the magnet system, it is advantageous if a transport container for the magnet system, or parts of the vehicle on which the magnet system is mounted, are configured as functional elements of the iron shield.

BRIEF DESCRIPTION OF THE DRAWING

Further details and features of the invention will be evident from the following description of a specific exemplary embodiment, with reference to the drawing in which.

DETAILED DESCRIPTION

Figure 1:
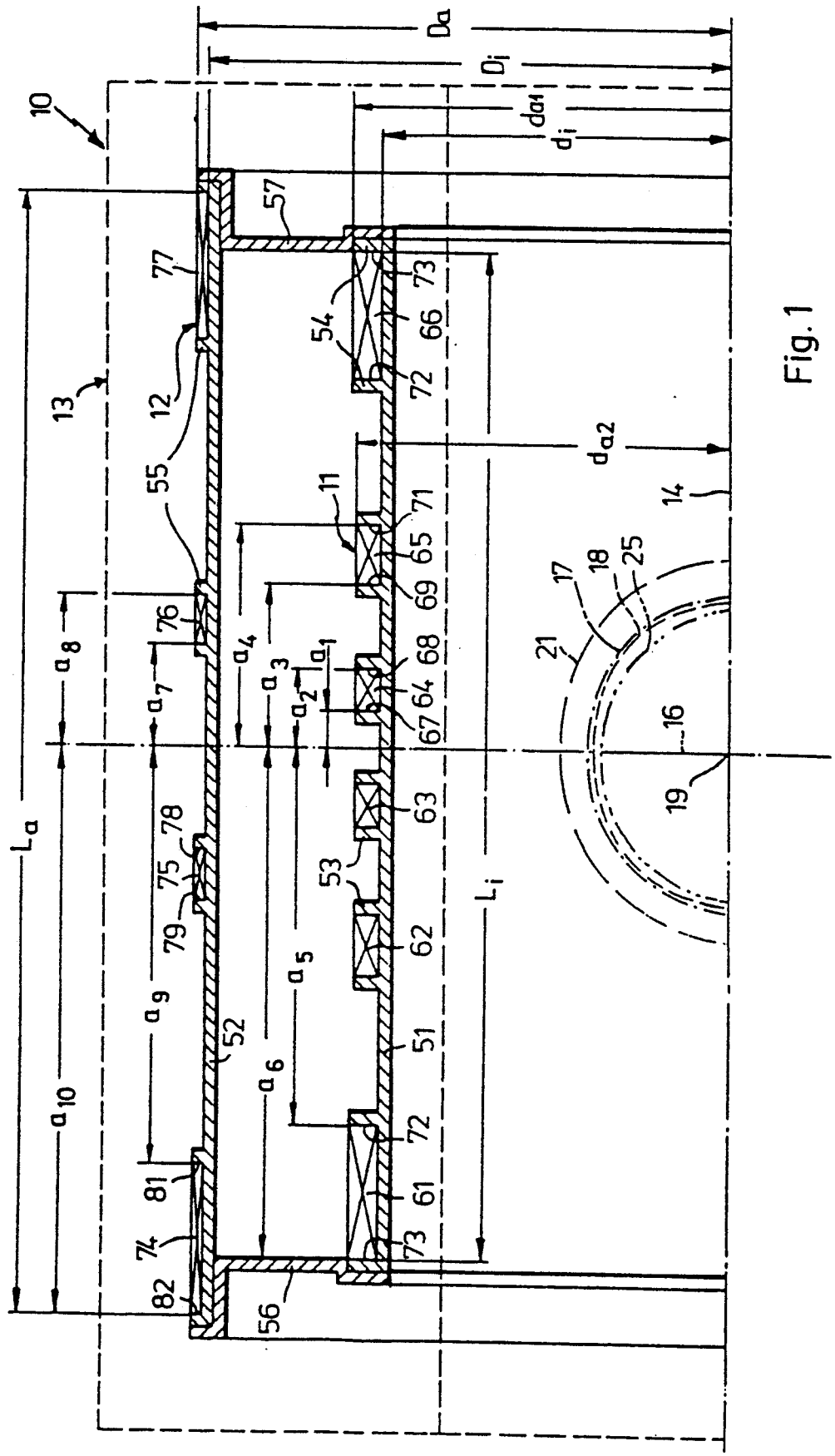
FIG. 1 shows a superconducting magnet system according to the invention, consisting of two field coils, in section along a radial plane containing its central longitudinal axis.

The magnet system according to the invention, referred to in its entirety as 10 and illustrated in FIG. 1, whose details should now be specifically referred to, is a superconducting magnet system consisting of an inner field coil 11 and an outer field coil 12, which is arranged in a cryostat 13 (indicated only schematically), in which the low temperature necessary for superconductivity of the two field coils 11 and 12 can be maintained for long periods of time.

The structure of cryostat 13 required for this purpose—with a chamber filled with liquid helium that houses superconducting coils 11 and 12, a chamber filled with liquid nitrogen that surrounds the helium chamber on all sides, and vacuum chambers and radiation shields arranged between the latter and the outer skin of the cryostat—can be assumed to be know in the art, and is therefore not illustrated in detail.

Field coils 11 and 12 and cryostat 13 are rotationally symmetrical with respect to their common central longitudinal axis 14, and configured symmetrically with reference to transverse median plane 16 of magnet system 10 at right angles thereto, the said plane running perpendicular to the plane of the drawing as depicted in FIG. 1.

Inner and outer field coils 11 and 12 are, each configures independently, configured so that they can generate, within relatively large central volume regions 17 and 18 characteristic of the respective coils 11 and 12, a largely homogeneous magnetic field of high field strength aligned parallel to central axis 14 of magnet system 10, this field being suitable for the performance of NMR spectroscopic and NMR tomographic experiments.

The axial and radial extent of homogeneity regions 17 and 18, within which the value of ratios $\Delta B(r,z)_i:B_{o\,i}$ and $\Delta B(r,z)_a:B_{o\,a}$—namely the ratios between the deviations $\Delta B(r,z)i,a$ (where i="inner" and a ="outer") of the field strengths, and the field strengths $B_{o\,i,a}$ of magnetic fields $B_i$ and $B_a$ generated at the center 19 of the two field coils 11 and 12 respectively—corresponds to no more than a predefined value of, for example, 10 ppm, are generally of different magnitudes if field coils 11 and 12 are configured differently. In the specific exemplary embodiment illustrated here, however, homogeneity regions 17 and 18 of inner field coil 11 and outer field coil 12, respectively, are, considered independently, approximately of the same magnitude, since the larger diameter of outer field coil 12 approximately compensates for the lower relative homogeneity.

In coil configuration 11, 12 illustrated in FIG. 1, in which inner field coil 11 is a 12th-order coil (i.e. the gradients of its field $B_i$ developed according to Legendre polynomials disappear up to the 11th order ) and outer field coil 12 is an 8th-order coil (i.e. the gradients of its field B1 disappear up to the 7th order), there results for the two field coils 11 and 12 the qualitative size relationship illustrated between their homogeneity regions 17 and 18, which have approximately the shape of ellipsoids of rotation whose common rotation axis is central longitudinal axis 14 of the magnet system.

In the configuration of the two field coils 11 and 12 explained so far, homogeneity region 17 of inner field coil 11 is approximately identical to homogeneity region 18 of outer field coil 12.

When the magnet system is operating normally, i.e., without malfunctions, the two field coils 11 and 12 are connected in series, and thus the same current I flows through them.

They are specifically configured with relation to one another so that the field strength $B_{o\,i}$ of the axial field generated by inner field coil 11 in center 19 of magnet system 10 is three times greater, in terms of value, than the field strength $B_{o\,a}$ of the axial field generated by outer field coil 12 at the center 19 of magnet system 10; moreover the two field coils 11 and 12 are configured, in terms of the geometrical arrangement of their superconducting turns, in such a way that the field strengths of the magnetic fields generated in the outer space of magnet system 10 by the two field coils 11 and 12, considered independently, whose field profiles each correspond (to a very good approximation) to that of a magnetic dipole, are essentially equal in value, i.e. differ from one another in terms of value, above a minimum distance R from center 19 of magnet system 10, by only a negligibly small amount $\Delta B(R)$, which depends on distance R from the center 19 of magnet system 10 and decreases drastically with increasing distance R.

Thus two operating modes of magnet system 10 are possible, one of which can be described as "shielding mode," and the other as "high-field mode."

In shielding mode, current passes through the two field coils 11 and 12 in such a way that the magnetic fields generated by inner field coil 11 and outer field coil 12 are aligned opposite to one another. This effectively compensates, in the outer space of the magnet system, for the magnetic dipole fields generated therein by field coils 11 and 12, and results in outward shielding of the magnetic field generated by magnet system 10 as a whole. In this shielding mode of magnet system 10, although the value of the field strength of the magnetic field generated at the center 19 from the mutual superposition of the magnetic fields generated by each of the two field coils 11 and 12 corresponds only to the difference in the values $|B0_i| - |B_{o\,a}|$ of the magnetic fields generated by inner and outer field coils 12, each considered separately—and thus, in the specific exemplary embodiment selected for explanation, to a field strength that corresponds to only 2/3 of the field strength of the magnetic field generated at the center 19 by inner field coil 11 alone—a definite enlargement of homogeneity region 21 occurring in shielding mode is nevertheless achieved. The shielding mode is therefore particularly favorable if magnet system 10 is to be used for tomographic purposes. In the high-field mode, current passes through field coils 11 and 12 in such a way that the individual magnetic fields generated by the two field coils 11 and 12 are aligned in the same direction, i.e., are "additively" superimposed. The value of the resulting magnetic field strength at the center 19 of magnet system 10 in this operating mode corresponds to the sum of the individual values $|B_{0\,i}| + |B_{0\,a}|$ of the magnetic fields individually generated by field coils 11 and 12, and is thus twice as great as in shielding mode. In comparison with the latter, however, a diminution of the usable homogeneity region 22 must be accepted in high-field mode. The high-field mode of magnet system 10 is thus especially suitable when the system is used for NMR spectroscopy purposes.

Figure 2:
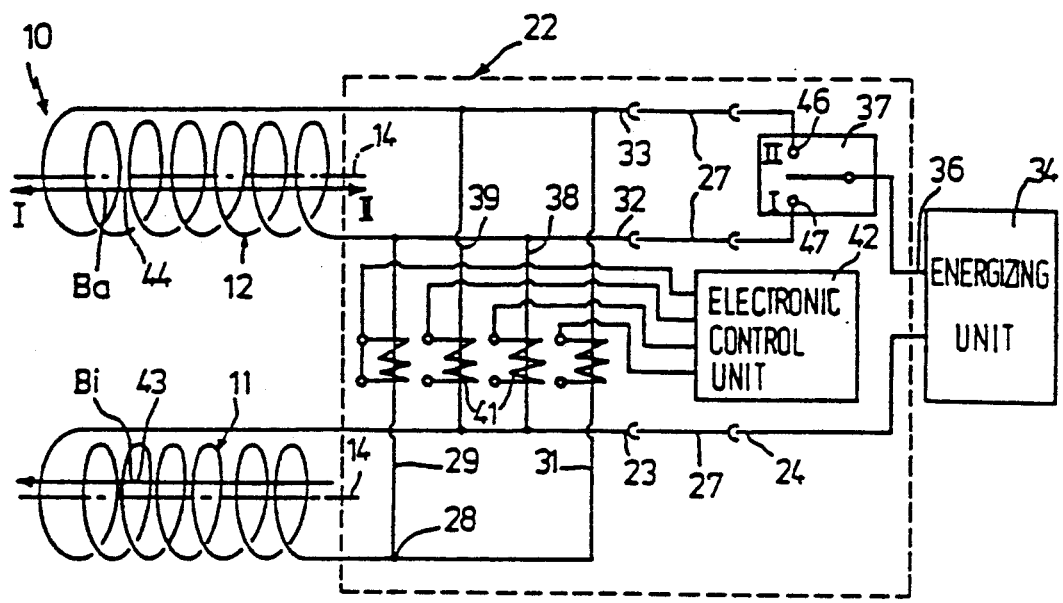
FIG. 2 shows the magnet system according to FIG. 1 with a superconducting switching network as the operating mode selector switch device, in a simplified, schematic block diagram depiction.

In order to allow operation of magnet system 10 alternatively in the two operating modes, provision is made for an operating mode selector switch device, illustrated in FIG. 2 (whose details should now be referred to) and labeled 22 in its entirety, by means of which the two field coils 11 and 12 can easily be energized with the superconductivity current flow direction required for the particular operating mode.

To simplify the depiction, the two field coils 11 and 12, which are arranged coaxially in terms of their common central longitudinal axis 14, are shown side by side in FIG. 2.

Operating mode selector switch device 22 is configured, in the specific exemplary embodiment illustrated, so that energizing current is delivered through outer field coil 12, and energizing current is returned through inner field coil 11 connected in series with outer field coil 12; return connection 23 of field coil 11 is electrically connected to the corresponding connection 24 of energizing current supply unit 26, via conductor element 27 which can be removed after coils 11 and 12 are energized.

Energizing current field connection 28 of inner field coil 11 is connected, via superconducting energizing current paths 29 and 31, to supply connections 32 and 33 respectively of outer field coil 12, through which, alternatively and depending on the operating mode for which magnet system 10 is to be energized, the energizing current provided by energizing unit 34 at its supply output 36 is fed into magnet system 10. The operating mode of the magnet system—high-field mode or shielding mode—is "selected" by means of a selector switch 37, which can be moved from its center "off" position to a function position I, in which energizing current supply output 36 of energizing unit 34 is electrically connected to a supply connection 32 of outer field coil 12, shown at the bottom in FIG. 2, or to a function position II, in which the other supply connection 33 of outer field coil 12, shown at the top of Figure, is connected to energizing current output 36 of energizing unit 34.

Supply connections 32 and 33 of field coil 12 can each also be connected, via superconducting operating current paths 38 and 39 respectively, to return connection 23 of inner field coil 11, and are connected when magnet system 10 is in steady-state operation.

Energizing current paths 29 and 31 and operating current paths 38 and 39 can be heated, over portions of their length, by means of electrically driven heating elements 41, and can thus be switched from the superconducting to the resistively conducting state, so that they can be operated as electrical switches which switch into their "off" state by activation of the corresponding heating element, and switch back to their superconducting state when the heat energy is turned off.

Energizing current paths 29 and 31 and operating current paths 38 and 39 form, together with heating elements 41, a superconducting switching network whose possible switching states can be controlled as required by an electronic control unit 42, as schematically indicated.

For example, magnet system 10 can be energized for its shielding mode, using operating mode selector switch device 22, as follows:

Once magnet system 10, including its superconducting network 29, 31, 38, 39, 41, has been brought into the superconducting state, energizing current path 31 (which connects supply connection 33 of outer field coil 12 to energizing current feed connection 28 of inner field coil 11), operating current path 39 (which connects the same supply connection 33 of outer field coil 12 to return connection 23 of inner field coil 11), and operating current path 38 (which connects the other supply connection 32 of outer field coil 12 to return connection 23 of inner field coil 11) are heated by means of heating elements 41 associated with them, and thus made to block the passage of superconductivity current. Initially, only energizing current path 29, which connects supply connection 32 of outer field coil 12 to energizing current feed connection 28 of inner field coil 11, remains superconducting. The energizing current coupled into magnet system 10 from energizing unit 34 via selector switch 37, which during the energization phase is successively increased to its reference value, flows, in the energization phase, via the return connection of inner field coil 11 back to energizing unit 34. Since the two field coils 11 and 12 are wound in the same direction when viewed along their common central longitudinal axis 14, while because of the current flow resulting from function position II or selector switch 37, and the utilization of energizing current path 29, energizing current passes through them in opposite directions, the fields B1 and B2 generated by them, which are represented by arrows 43 and 44 respectively, are aligned in opposite directions.

Once the energizing current has reached its reference value, heating of operating current path 39 is discontinued; it thereupon becomes superconducting, and connects return connection 23 of inner field coil 11 to supply connection 33 of outer field coil 12, through which magnet system 10 had been energized for the "shielding" operating mode. Energizing unit 14 is now bypassed by this operating current path, and the superconducting operating current circuit providing shielding operation of magnet system 10 is closed. As soon as this occurs, heating of operating current path 38, which connects return connection 23 of inner field coil 11 to supply connection 32 (not utilized during energization) of outer field coil 12, is discontinued, as is heating of energizing current path 31, which with the type of energization explained above was not utilized, so that these current paths also become superconducting. After this, by removing conductor elements 27—by which (in energization mode) fixed contact 46 of selector switch 37 was connected to supply connection 33 of outer field coil 12, and return connection 24 of energizing unit 34 was connected to return connection 23 of inner field coil 11—superconducting magnet system 10 can be uncoupled form the resistive power supply section.

Magnet system 10 is energized for the high-field operating mode with the selector switch in function position I: in this case, during energization, energizing current path 31 (which connects energizing current feed connection 28 of inner field coil 11 to supply connection 33 of outer field coil 12) is kept superconducting, while energizing section 29 and operating current paths 38 and 39 are heated during the energization phase and therefore remain in a resistive state which blocks superconductivity current. Energizing current thus flows from output 36 of energizing unit 34, through selector switch 37 (which is in function position I), to supply connection 32 of outer field coil 12, through the latter and energizing current path 31 (which is still superconducting), to energizing current feed connection 28 of inner field coil 11, and through the latter back to energizing unit 34. Once the superconductivity current flowing in magnet system 10 has reached its reference strength, heating of operating current path 38 is discontinued, and it thereupon goes into the superconducting state, and now bypasses energizing unit 34 and closes the circuit within the superconducting system. Then heating of operating current path 39 and energizing current path 29 is also discontinued. As soon as these two current paths 39 and 29 have also become superconducting, magnet system 10 can be electrically uncoupled from the power supply side by removing conductive element 27 which connects return connection 23 of inner field coil 11 to return connection 24 of energizing unit 34, and conductive element 27 which connects supply connection 32 (used in this case) of outer field coil 12 to fixed contact 47 of selector switch 37 during the energization phase.

If a fault is present in outer field coil 12, magnet system 10 can continue to be operated with inner field coil 11, the only one which remains functional. The latter can then be energized, with selector switch 37 in position II, via energizing current path 31 which is kept in the superconducting state, and can, by bringing operating current path 39 into its superconducting state, be short-circuited, so that a superconductivity current circulating in inner field coil 11 can be achieved. In the aforesaid case of a malfunction in outer field coil 12, it is also possible, with selector switch 37 in position I, to energize inner field coil 11 via energizing current path 29 (which is in the superconducting state), and to short-circuit it by switching operating current path 38 to its superconducting state.

If, on the other hand, a fault occurs in inner field coil 11, magnet system 10 can also be operated with its outer field coil 12 only. The latter can then be energized, with selector switch 37 in position II, via operating current path 38, which is kept in the superconducting state, and can be short-circuited by means of operating current path 39, which is blocked during energization and then switched to its superconducting state. Outer field coil 12 can also be energized with selector switch 37 in position I, in this case by means of operating current path 39 (which is in the superconducting state), and can, by means of operating current path 38, which is kept in the blocked state during energization, be short-circuited by switching the latter path into its superconducting state.

It is obvious that a superconducting magnet system with the functional characteristics explained above can also be implemented in such a way that the outer and inner field coils are wound in opposite directions. Assuming such a configuration of the magnet system, energization thereof as explained above for the high-field mode will result in current flow suitable for the shielding mode of the magnet system, while energization as explained above for the "shielding" operating mode will result in a current flow suitable for the "high-field" operating mode.

Selector switch 37 with the specific function explained above is not necessary when the polarity of the fields generated by the two field coils 11 and 12 is of no importance, i.e., when it is simply necessary to guarantee that these fields have opposite polarity in the shielding mode of magnet system 10, and the same polarity in its high-field mode.

Figure 3:
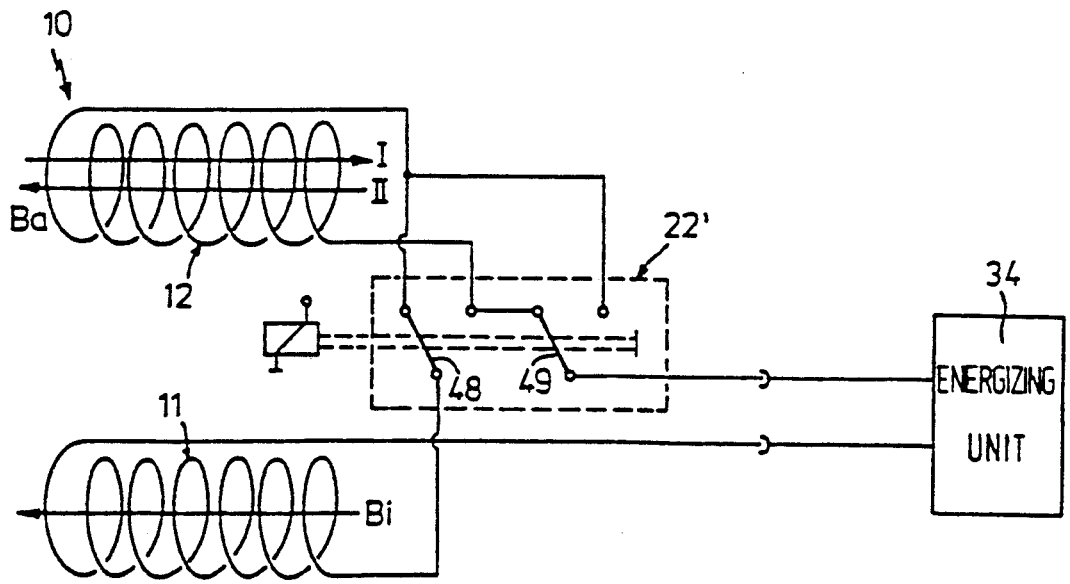
FIG. 3 shows the magnet system according to FIG. 1 with a mechanical operating mode selector switch device, in a depiction corresponding to FIG. 2.

Magnet system 10 illustrated in FIG. 3, whose details should now be referred to, differs from the one in FIG. 2 in design terms only in the configuration of operating mode selector switch device 22' (which is configured here as either a simple electrically controlled change-over relay, or a simple manually actuated multiple-contact switch with mechanically movable switch contacts 48 and 49) and in functional terms by the fact that energizing unit 34 must remain connected to magnet system 10 even while the latter is in its investigative or experimental mode.

Switch 22' can be changed over between two function positions I and II; function position II, with switch contacts 48 and 49 shown in solid lines, is associated with the "high-field" operating mode, while function position I, with switch contacts 48 and 49 shown in dashed lines, is associated with the "shielding" operating mode of magnet system 10.

The configuration of operating mode selector switch device 22' depicted in FIG. 3 is suitable both for a superconducting magnet system 10 and for a magnet system with resistive field coils 11 and 12.

The directions of the $B_a$ fields generated by outer field coil 12 associated with the various operating modes I and II are correspondingly labeled I and II.

To explain a specific configuration of coil system 10, reference with now be made again to the relevant details of FIG. 1, which reproduces the configuration of inner and outer field coils 11 and 12 in a scale longitudinal section depiction.

Inner field coil 11 consists of a total of six subcoils 61–66, which, each considered separately, extend over only a fraction of the total axial length $L_1$ of inner field coil 11, and are electrically connected in series in the order of their reference numbers.

These subcoils 61 and 66 have a rectangular cross section when viewed in the section plane of FIG. 1. Subcoils 61 and 66 of inner field coil 11 each have the same internal diameter $d_1$.

The two outer field windings 61 and 66 of inner field coil 11 have an outside diameter $d_{a1}$, which is somewhat greater than the outside diameter of the innermost subcoils 63 and 64 and that of the middle subcoils 62 and 65 located between them and the outer field windings 61 and 66, with these middle subcoils 62 and 65 and inner subcoils 63 and 64 having the same outside diameter $d_{a2}$.

The inner ends 67 of inner subcoils 62 and 65 of inner field coil 11 are at an axial distance $a_3$ from its plane of symmetry, and their outer ends 71 are at an axial distance $a_4$.

The inner ends 72 of outer subcoils 61 and 66 are at an axial distance $a_5$ from symmetry plane 16 of magnet system 10. The axial distance $a_6$ of outer end 73 of outer subcoils 61 and 62 of inner field coil 11 corresponds to half its length $L_1/2$.

Outer field coil 12 consists of a total of four subcoils 74 to 77, which are electrically connected in series in order of their reference numbers 74, 75, 76 and 77, each extend over only a portion of the total length $L_a$ of outer field coil 12, and, in the representation of FIG. 1, have a rectangular cross section.

The axial distance between inner ends 78 of inner subcoils 75 and 76 and symmetry plane 16 of magnet system 10 is equal to $a_7$.

The axial distance between outer end 79 of inner subcoils 75 and 76 and the central symmetry plane 16 of magnet system 10 is equal to $a_8$.

The axial distance between inner ends 81 of outer subcoils 74 and 77 of outer coil 12 and its symmetry plane 16 is equal to $a_9$. The axial distance $a_{10}$ between outer end 82 of outer subcoils 74 and 77 of outer field coil 12 and its central symmetry plane 16 corresponds to half the value $L_a/2$ of the total length $L_a$ of outer field coil 12.

Outer subcoils 74 and 77 of outer field coil 12 each have 2,832 turns. Inner subcoils 75 and 76 of outer field coil 12 each have 1,056 turns. These turns of outer and inner subcoils 74, 77 and 75, 76 of outer field coil 12 are each arranged in 16 radially superimposed layers of turns.

Outer subcoils 61 and 66 of inner field coil 11 each have 5,304 turns, which are arranged in 34 radially superimposed layers of turns. Middle subcoils 62 and 65 of inner field coil 11 each have 1,960 turns, which are arranged in 28 radially superimposed layers of turns.

Inner subcoils 63 and 64 of inner field coil 11 each have 1,456 turns, which are also arranged in 28 radially superimposed layers of turns.

Subcoils 61 to 66 of inner field coil 11 and subcoils 74 and 77 of outer field coil 12, all of which are electrically connected to one another in series, are configured so that when magnet system 10 is in operation, the same current density $I/cm^2$ results for both field coils 11 and 12.

Subcoils 61 to 66 of inner field coil 11 and subcoils 74 to 77 of outer field coil 12 are each wound onto a coil support 51 and 52 with a basic cylindrical tubular shape. Coil supports 51 and 52 are provided on their outer surfaces with radial annular flanges 53 and 54, and 55, respectively, which form, in pairs, the axial boundaries of coil boxes in which subcoils 61 to 66 of inner field coil 11, and subcoils 74 to 77 of outer field coil 12, are retained in an axially immovable manner and radially supported on the inside. The two essentially tubular coil supports 51 and 52 are permanently mechanically connected to one another at their ends by essentially annular end plates 56 and 57. Coil supports 51 and 52 and end plates 56 and 57 are usually made of aluminum. The support and retaining structures by which magnet system 10 is permanently mounted inside cryostat 13 are not shown, in the interest of simplified depiction. In a specific embodiment of coil system 10 with inner field coil 11 as a 12th-order coil and outer field coil 12 as an 8th-order coil, their geometrical parameters $a_1$ to $a_{10}$, $d_{a1}$ and $d_{a2}$, and $D_i$ and $D_a$, have the following values:

$a_1$: 6.43 cm
$a_2$: 14.24 cm
$a_3$: 28.99 cm
$a_4$: 39.57 cm
$a_5$: 66.13 cm
$a_6$: 89.50 cm
$a_7$: 17.77 cm
$a_8$: 25.65 cm
$a_9$: 73.50 cm
$a_{10}$: 100.00 cm
$d_i$: 61.43 cm
$d_{a1}$: 66.53 cm
$d_{a2}$: 65.63 cm
$D_i$: 91.93 cm
$D_a$: 94.33 cm

Magnet system 10 with this geometrical configuration of its field coils 11 and 12 is operated, in a typical application, with a current density of 8,333 A/cm$^2$. With the turns and layers of turns indicated above, the resulting operating current strength for magnet system 10 is 187.5 A.

Figure 4:
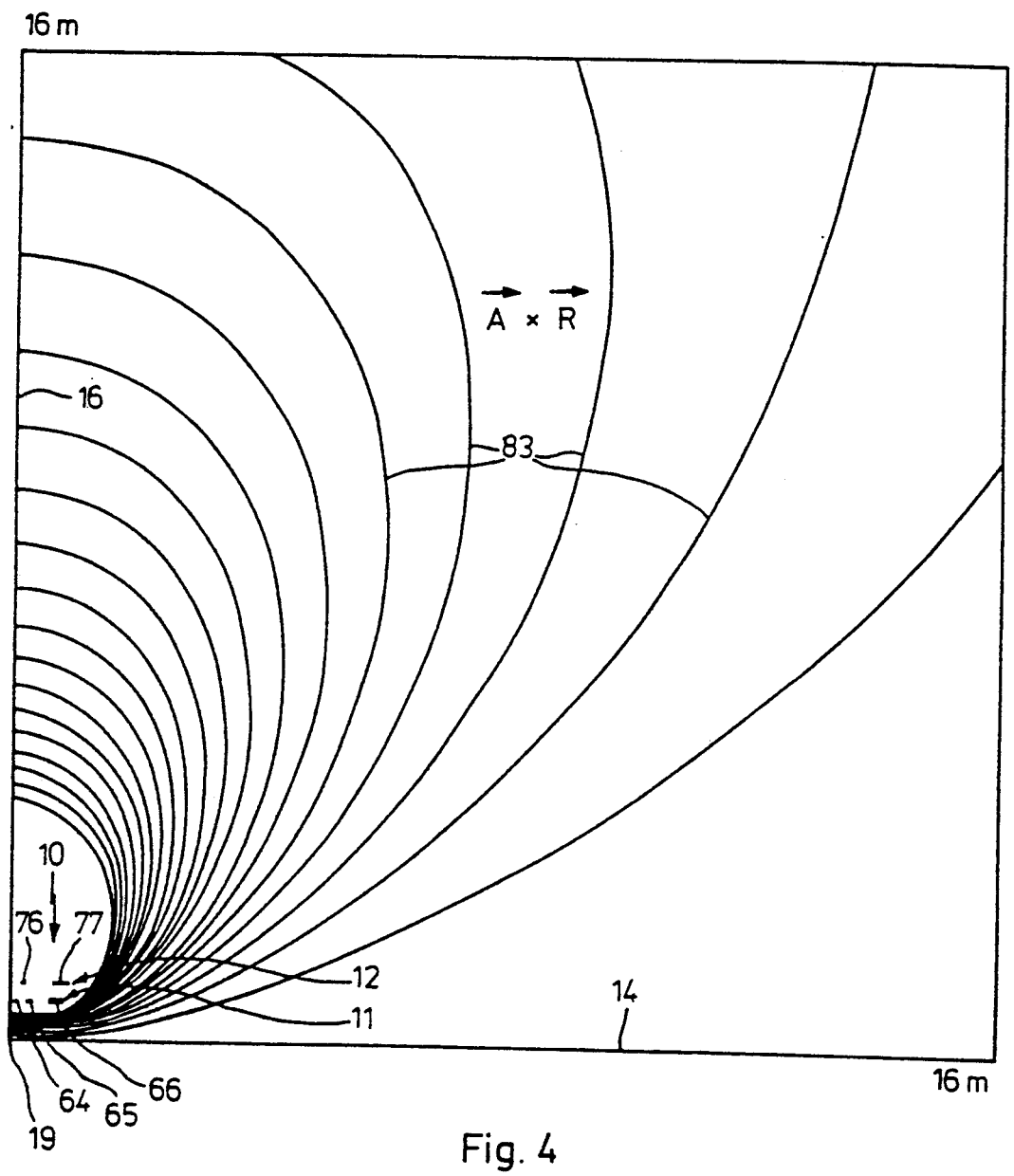
FIG. 4 shows a plot of the field lines ($\vec{A} \times \vec{R}$) of the magnetic field generated by the magnet system according to FIG. 1 in its high-field operating mode.

Under these operating conditions, magnet system 10 generates a B field with the B field line profile 83 illustrated qualitatively in FIG. 4, whose details should now be referred to, the profile of which in the outer space of magnet system 10 corresponds (to a first approximation) to that of a magnetic dipole field, while in the inner space of magnet system 10, i.e., inside length $L_i$ of inner field winding 11, the field lines run approximately parallel to central longitudinal axis 14 of magnet system 10. To simplify the depiction, FIG. 4 illustrates only the "1st" quadrant of the field profile ($\vec{A} \times \vec{R}$) in a plane containing central axis 14 of magnet system 10 and extending at right angles to symmetry plane 16 of magnet system 10, with the axial and radial extent of the region illustrated measuring in each case 16 m from the center 19 of magnet system 10.

Figure 5:
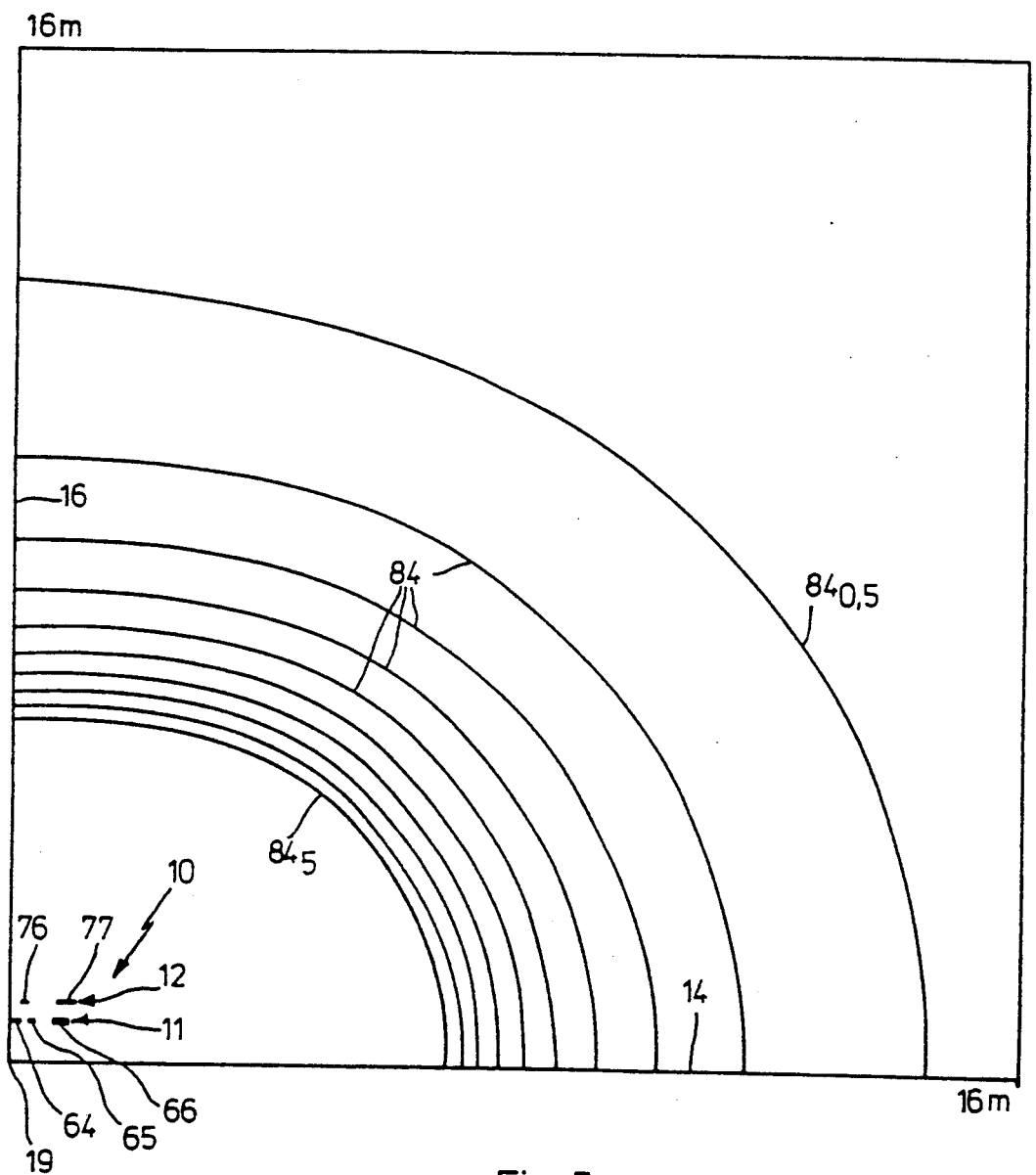
FIG. 5 shows a plot of lines of equal magnetic field strength in the outer space of the magnet system according to FIG. 1, in high-field mode.

With magnet system 10 in its high-field mode, FIG. 5, whose details should now also be referred to, illustrates the profile of the equal field strength lines 84 ("equifield lines") that results in the outer space of magnet system 10, which approximately corresponds to the contours of ellipses that intersect symmetry plane 16 of magnet system 10, and its central axis 14, in each case at right angles. As illustrated to scale in FIG. 5, equifield line $84_5$ corresponding to a field strength of 5 mT intersects symmetry plane 16 of magnet system 10 at a radial distance of 5.4 m measured from the center 19 of magnet system 10, and central axis 14 of magnet system 10 at an axial distance of 6.8 [m]. Equifield line $84_{0.5}$ corresponding to 1/10 of this field strength intersects symmetry plane 16 of magnet system 10 at a radial distance of 12 m, and central longitudinal axis 14 of magnet system 10 at an axial distance of 14.5 m.

Figure 6:
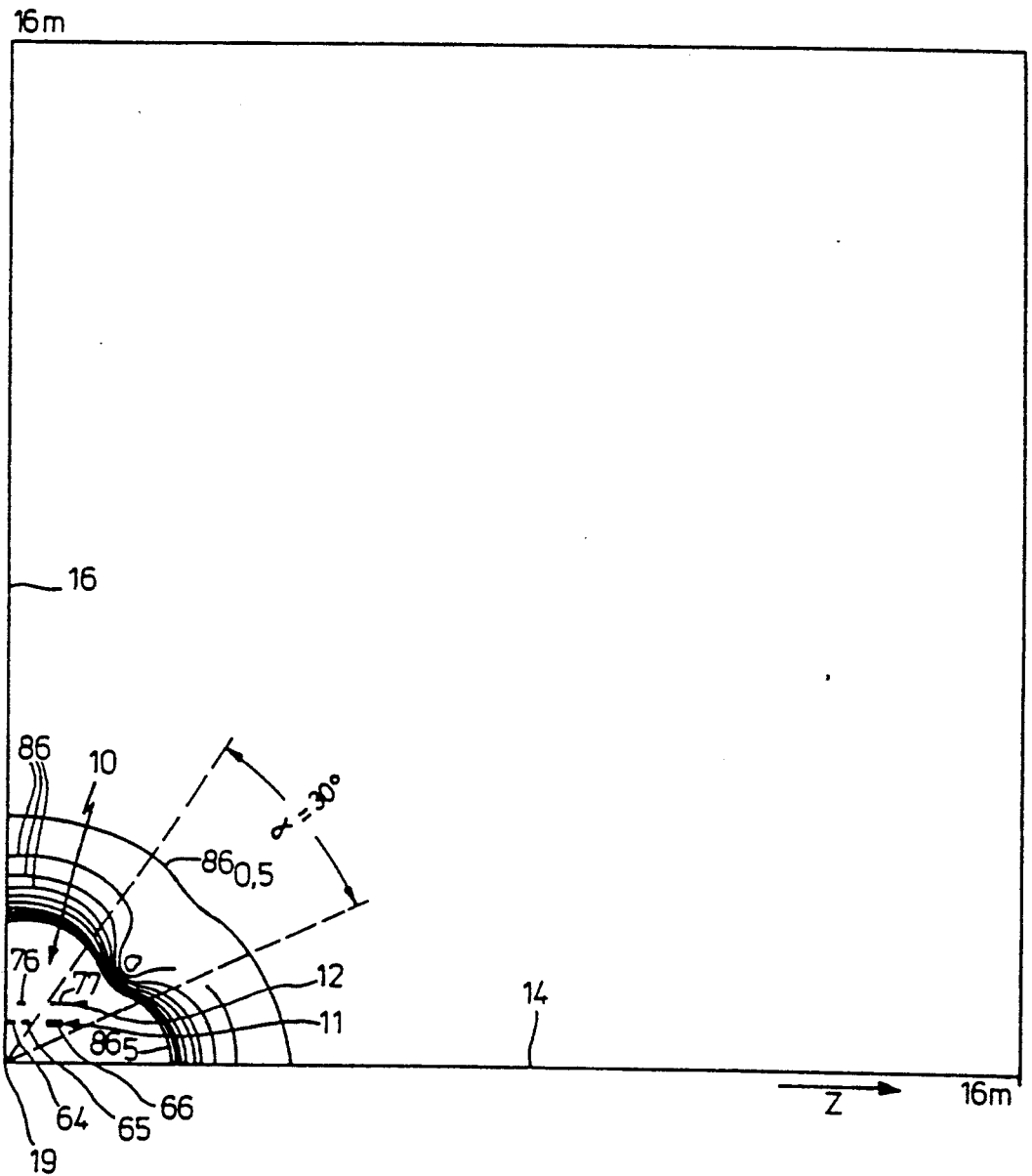
FIG. 6 shows a plot of lines of equal field strength of the field generated by the magnet system according to FIG. 1 in its outer space in shielding mode.

FIG. 6, whose details should now be referred to, shows—in a depiction which corresponds to the depiction in FIG. 5, including scale—the profile of equifield lines 86 for the shielding mode of magnet system 10, which results in a field strength of 1 Tesla at the center 19 of magnet system 10.

In this case, the 5 mT equifield line $86_5$ intersects symmetry plane 16 of magnet system 10 at a radial distance of approximately 2.3 m from the center 19 of magnet system 10, and central longitudinal axis 14 at a distance of 2.5 m; while field line $86_{0.5}$, corresponding to a field strength of 0.5 mT, intersects symmetry plane 16 of magnet system 10 at a radial distance of 3.9 m and central longitudinal axis 14 of magnet system 10 at an axial distance of 4.4 m, measured in each case from the center 19. Inside an angular region $\alpha$ of approximately 30 degrees, (which is sector-shaped when viewed from the center 19 of magnetic field 10) which lies between 25 degrees and 55 degrees when measured from central longitudinal axis 24, equifield lines 86 have a profile which—when viewed in the plane of the illustration—bends in towards the center 19 of magnet system 10 and substantially departs from the elliptical, with the region within which the field strength of the magnetic field drops to a value of 0.5 mT being substantially smaller (i.e., by a factor of $\frac{1}{3}$) than in the high-field operating mode of magnet system 10.

Figure 7:
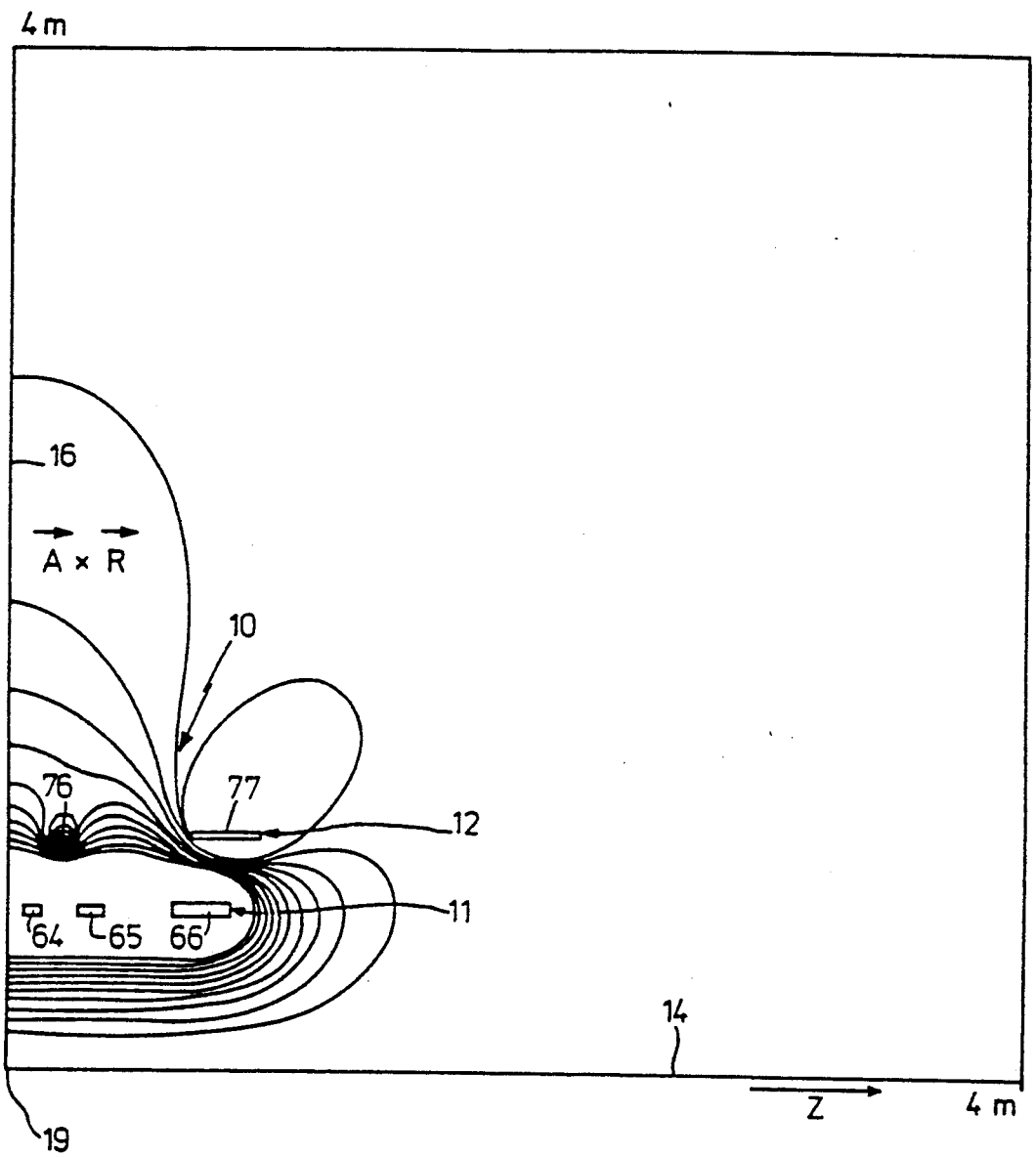
FIG. 7 shows a plot of the magnetic field lines ($\vec{A} \times \vec{R}$), in shielding mode, of the magnet system according to FIG. 1.

The reason is that with magnet system 10 in shielding mode, the magnetic field generated by the latter—the field line profile ($\vec{A} \times \vec{R}$) of which is reproduced in FIG. 7 (whose details should now be referred to) in a depiction corresponding to FIG. 4 but at a scale enlarged by a factor of four—is largely enclosed "inside", i.e., "between" inner field coil 11 and outer field coil 12, and leakage fields can emerge to a much lesser extent into the outer space of magnet system 10.

When reference numbers are indicated in FIGS. 4 to 7 and are not specifically mentioned in the relevant portions of the description, they signify a reference to the description of the previous, identically referenced elements of magnet system 10.

Figure 8A:
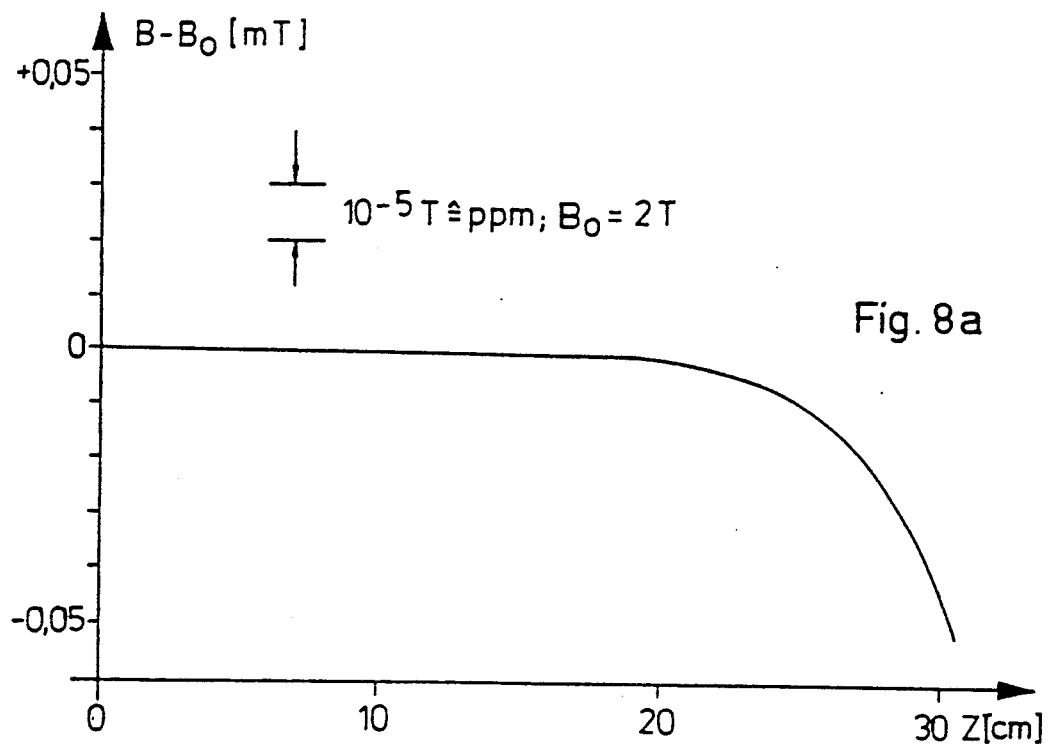
FIGS. 8a and 8b show an illustration of the homogeneity region of the magnetic field at the center of the magnet system according to FIG. 1, for the high-field operating mode (FIG. 8a) and for the shielding operating mode (FIG. 8b)
Figure 8B:
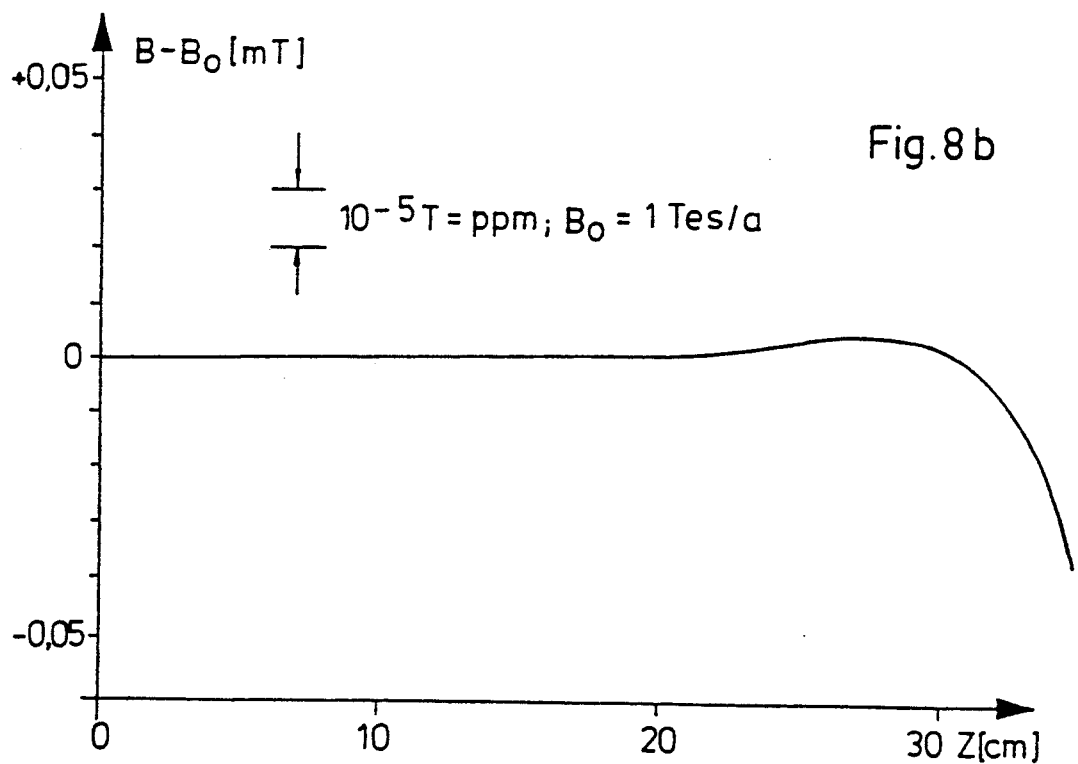

FIGS. 8a and 8b, whose details should now be referred to, depict for high-field mode (FIG. 8a) and shielding mode (FIG. 8b) of magnet system 10, plots for the deviation $\Delta B = B - B_0$ of the field strength B of the B field generated by magnet system 10 from the value $B_0$ of the field strength at the center 19 of magnet system 10, as a function of distance Z from the center 19, measured along central axis 14.

As is immediately evident from a comparison of FIGS. 8a and 8b, the axial region within which field strength B differs by less than 10 ppm from the field strength $B_0$ prevailing at the center - i.e., by less than $2 \cdot 10^{-5}$ T for the high-field mode, and by less than $10^{-5}$ T for the shielding mode ($B_0 = 1$ T)—is different, being substantially (i.e. more than 20%) greater in the shielding mode than in the high-field mode of magnet system 10.

This difference in homogeneity results from the different 8th-order coefficient of outer field coil 12, which is negative. In shielding mode, in which outer field coil 12 carries negative current, the 8th-order contribution leads to an advantageous enlargement of the homogeneity region along the axis of rotation, and in the plane of reflection 16, perpendicular thereto, in the radial direction.

Figure 9A:
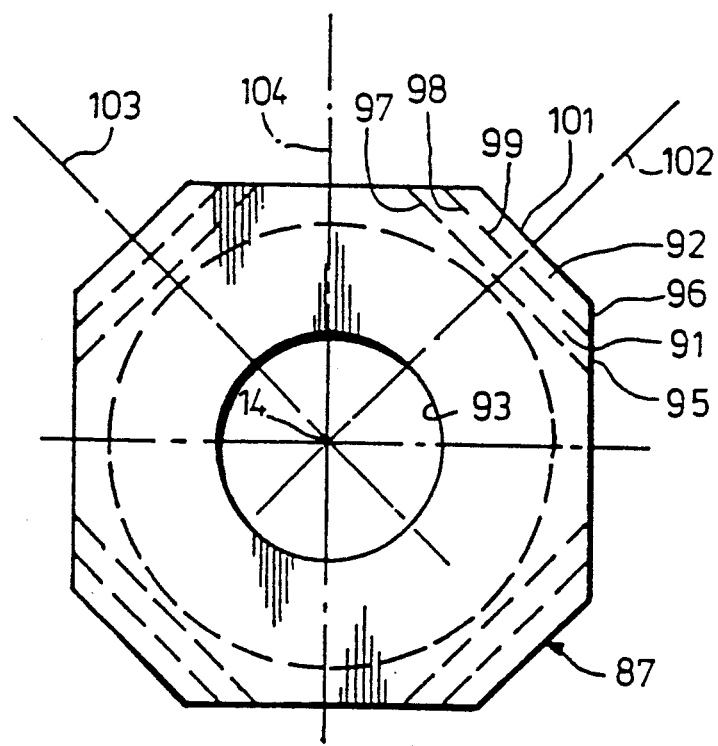
FIGS. 9a and 9b show the basic structure of an iron shield which can be used in conjunction with the magnet system according to FIG. 1 in its various operating modes, including those in which only one field coil is energized, and can be adapted to these operating modes, in a view from the end (FIG. 9a) and in a schematic, simplified, perspective view (FIG. 9b).
Figure 9:
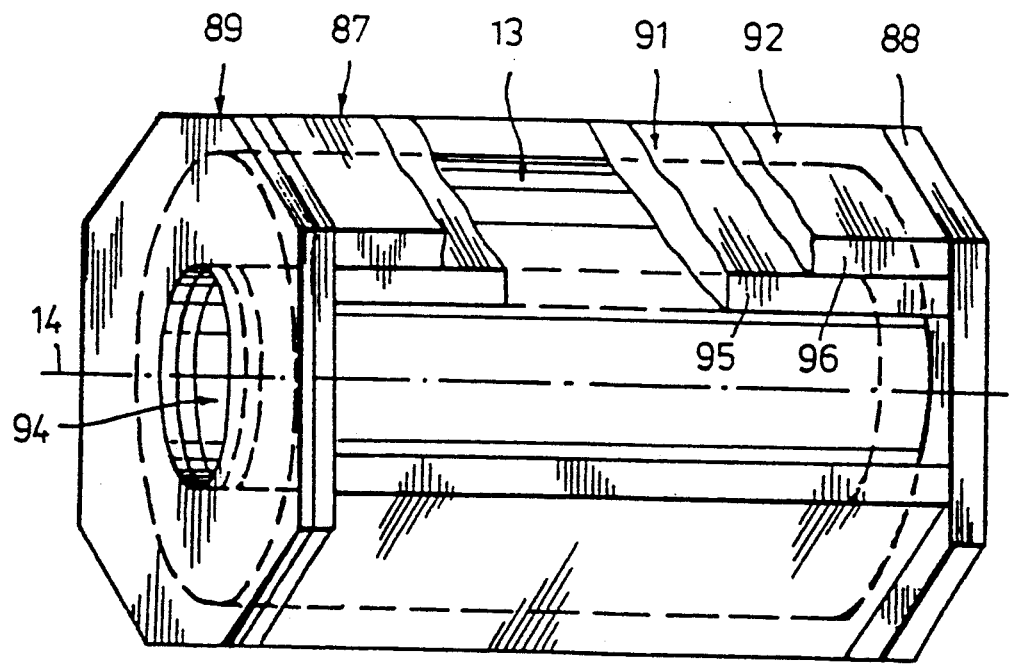

Lastly, FIGS. 9a and 9b, whose details should be expressly referred to, explain simple embodiment possibilities of an iron shield, labeled 87 in its entirety, which for example can provide shielding of the magnetic field that would otherwise be generated in the outer space by magnet system 10, even when magnet system 10 is being used in high-field mode. The same applies, analogously, when magnet system 10 is being operated with only one of its field coils 11 or 12.

This shield 87 has fourfold symmetry in terms of its central longitudinal axis 14, which in the operating position of shield 87 coincides with central axis 14 of magnet system 10. Shield 87 consists of end plates 88 and 89 running perpendicular to central longitudinal axis 14, and beam-shaped iron shielding elements 91 and 92 connecting the said plates together and running parallel to central longitudinal axis 14; the said elements are connected together in a removably solid manner by threaded connectors (not shown). End plates 88 and 89 have circular central openings 93, the diameter of which corresponds to the diameter of central hole 94 of cryostat 13 which contains magnet system 10. Beam-shaped shielding elements 91 and 92 are configured as iron plates with a trapezoidal cross section, the lateral flank surfaces 95 and 96 of which run at 45 degrees to base surfaces 97, 98, and 99, 101, respectively, of the inner beam-shaped shielding elements 91 and outer beam-shaped shielding elements 92, as depicted in FIGS. 9a and 9b; beam-shaped shielding elements 91 and 92 are arranged so that their longitudinal median planes 102 and 103 which run in the direction of central longitudinal axis 14 and intersect along the latter enclose in each case an angle of 45 degrees with the vertical longitudinal median plane 104 of the overall system comprising magnet system 10 and iron shield 87.

Iron shield 87 is configured so that end plates 88 and 89 can be placed in the immediate vicinity of the annular end surfaces of the casing of cryostat, and possibly even in contact with it, and also so that the radial distance between inner beam-shaped shielding element 91 and the outer casing surface of the cryostat casing is small, i.e., a few centimeters, so that iron shield 87 directly surrounds cryostat 13 when viewed in section in the latter's circumferential direction.

By appropriately taking into account the effect of iron shield 87 on the field profile inside magnet system 10, it is possible to achieve improved field homogeneity when the latter is in high-field mode. The same applies, analogously, to the case in which the magnet system is operated with only one of its two field coils 11 or 12, although then the iron shield must be adaptable to the particular mode in order to achieve optimum field homogeneity.

Such adaptation possibilities for iron shield 87 can involve, for example, the fact that the outer beam-shaped shielding elements 92 can be removed, and/or that the effective thickness of end plates 88 and 89 can be varied by removing or applying an additional end plate, as indicated schematically in the left part of FIG. 9b by a two-part end plate 89. It is evident that such end plate elements do not necessarily, as shown in FIG. 9b, need to have the same plate surface area and peripheral contour, but may possibly also be configured as round disks, the outside diameter of which is considerably smaller than the diameter, measured between parallel contour edges, of the end plates illustrated.

It is evident that the possibilities illustrated for configuring an iron shield 87 that can be used in conjunction with magnet system 10 cannot be exhaustive, but rather that it is entirely possible for one skilled in the art, having understood the aforesaid basic principle of a variable and adjustable iron shield, to determine its appropriate configuration by means of calculation and-/or experiment.

In a specific configuration not illustrated in the interest of simplicity, magnet system 10, possibly including an iron shield 87 as explained above, is embodied as a transportable unit, which can be transported by means of a vehicle to the particular utilization location, for example to a hospital where magnet system 10 is used primarily for tomographic purposes, or to a research institution where it can be used principally for spectroscopic purposes.

In the specific embodiment of such a transportable magnet system 10, it is advantageous if the latter, including the energizing unit, is permanently mounted on the transport vehicle, with parts of the transport vehicle being utilized as functional elements of the magnet system's iron Shield. In such an embodiment of magnet system 10 allowing versatile use, the latter is suitable as a shared or loaned system, which permits very economical operation both for the operator and for the user.

What is claimed is:

1. Magnet system for generating a magnetic field suitable for NMR experiments, having a high field strength in an experimental volume and sufficient homogeneity for NMR experiments, tomographic, and/or spectroscopic investigations, said magnet system comprising:

inner and outer superconducting field coil systems of different mean diameter arranged coaxially with respect to a longitudinal axis of the magnet system defined by a direction of a homogeneity region, said coil system being rotationally symmetrical and arranged symmetrically about a transverse median plane of the magnet system perpendicular to the longitudinal axis, said coil systems being capable of carrying exciting currents for producing over-lapping magnetic fields that compensate, at least approximately, for dipole fields of the two coil systems; and operating mode selector switch means for controlling current in the two coil systems so that in one operating mode dipole-field compensation in an outer space of the magnet system is provided and in another operating mode magnetic fields generated by the two coil systems, at the center thereof, are aligned in one direction.

2. Magnet system according to claim 1, wherein a ratio $B_{oi}:B_{oa}$ between values of field strengths $B_{oi}$ and $B_{oa}$ generated respectively by the inner field coil system and and the outer field coil system is equal to approximately 3.

3. Magnet system according to claim 1 wherein the inner field coil system is between an 8th-order coil and a 12th-order coil; and the outer field coil system is between a 6th-order coil and an 8th-order coil.

4. Magnet system according to claim 3, wherein the outer field coil system comprises at least four subcoils of the same winding density, arranged at axial distances from one another and through which, when viewed in a direction of a central axis of the magnet system exciting current flows in the same direction, said subcoils having same inside diameter $D_1$ and a same outside diameter $D_a$, with a number of turns in outer outer field subcoils being between 2.5 and 3.5 times greater than a number of turns in inner outer field subcoils of the subcoils, a radial thickness $(D_a-D_1)$ of the outer field subcoils being small compared to the mean diameter, $(D_a+D_1)/2$, thereof.

5. Magnet system according to claim 3 wherein the inner field coil system comprises at least six subcoils of the same winding density, arranged at axial distances from one another and through which, when viewed in a direction of a central axis of the magnet system, exciting current flows in the same direction said subcoils having a same inside diameter $d_1$, with a number of turns in middle inner field subcoils located between respective inner inner field subcoils and outer inner field subcoils, being between 1.3 and 1.6 times greater than a number in the inner inner field subcoils, and a number of turns in the outer inner field subcoils being between 3.5 and 4 times greater than the number in the inner, inner field subcoils, a radial thicknesses $(d_{a2}-d_{a1})$ of the inner and middle inner field subcoils and a radial thicknesses $(d_{a1}-d_1)$ of the outer inner field subcoils being small compared to the inside diameter, $d_1$.

6. Magnet system according to claim 4 wherein the inner field coil comprises at least six subcoils of the same winding density, arranged at axial distances from one another and through which, when viewed in the direction of the central axis of the magnet system, exciting current flows in the same direction, the inner field coils subcoils having a same inside diameter $d_1$, with a number of turns in middle inner field subcoils located between respective inner inner field subcoils and outer inner field subcoils being between 1.3 and 1.6 times greater than a number in the inner inner field subcoils, and the number of turns in the outer inner field subcoils being between 3.5 and 4 times greater than the number in the inner inner field subcoils, a radial thicknesses $(d_{a2}-d_{a1})$ of the inner and middle inner field subcoils and a radial thicknesses $(da_a-d_1)$ of the outer inner field subcoils being between 4 and 6%, and 5 and 7%, respectively, of the inside diameter $(d_1)$ a length $L_1$ of the inner field coil, measured between outer ends of the outer inner field subcoils, is between 85 and 95% of a correspondingly measured length $L_a$, measured between outer ends of the outer outer field subcoils, of the outer field coil, an inside diameter $D_1$ of the outer field coil corresponds to between 90 and 95% of the axial length $L_a$ of the outer field coil, and a ratio $D_1/d_1$ between the inside diameter $D_i$ of the outer field coil and the inside diameter $d_1$ of the inner field coil is equal to approximately 1.4.

7. Magnet system according to claim 1, wherein the two field coil systems are connected in series.

8. Magnet system according to claim 1, wherein the switch means comprises a superconducting switching network.

9. Magnet system according to claim 8 wherein the switching network comprises four superconducting electrical current paths, which can be switched, by heating, into a resistive state for blocking superconductivity current, such that each of two connections of the outer field coil system can be connected to and blocked off from each of two connections of the inner field coil system.

10. Magnet system according to claim 9 wherein the switching network is configured so that during energization, only one of the two superconducting current paths, by means of which the two field coils are connected in series with one another, is open in each case and, as soon as the reference current density is reached, the current path which bypasses the energizing unit and closes the circuit to the field coils, connected in series, is switched into the superconducting state, and thereafter the other two current paths are also switched to superconducting transmission.

11. Magnet system according to claim 1 further comprising shim system means for generating a field gradient in order that in an alternative operating mode, resulting in homogeneities of the magnetic field in an experimental volume can be at least partially compensated for.

12. Magnet system according to claim 1, further comprising a passive iron shield disposed around the inner and outer field coil systems, for preventing magnetic field generation outside of the magnetic system.

13. Magnet system according to claim 12, wherein the iron shield comprises end plates and beam-shaped elements axially connecting the said plates to one another, said iron shield surrounding a cryostat of the magnet system.

14. Magnet system according to claim 1 wherein the two field coil systems are connected in series and the switch means comprises a superconducting network.

15. Magnet system according to claim 14 wherein the inner field coil system is between an 8th-order coil and a 12th-order coil; and the outer field coil system is between a 6th-order coil and an 8th-order coil.

16. Magnet system according to claim 15 wherein the inner field coil system comprises at least six subcoils of the same winding density, arranged at axial distances from one another and through which, when viewed in a direction of a central axis of the magnet system, exciting current flows in the same direction, said subcoils having a same inside diameter $d_1$, with a number of turns in middle inner field subcoils located between respective inner inner field subcoils and outer inner field subcoils, being between 1.3 and 1.6 times greater than a number in the inner inner field subcoils, and a number of turns in the outer inner field subcoils being between 3.5 and 4 times greater than the number in the inner inner field subcoils, a radial thicknesses $(d_{a2}-d_{a1})$ of the inner and middle inner field subcoils and a radial thicknesses $(d_{a1}-d_1)$ of the outer inner field subcoils being small compared to the inside diameter, $d_1$.

17. Magnet system according to claim 15, wherein the outer field coil system comprises at least four subcoils of the same winding density, arranged at axial distances from one another and through which, when viewed in a direction of a central axis of the magnet system, exciting current flows in the same direction, said subcoils having same inside diameter $D_1$ and a same outside diameter $D_a$, with a number of turns in outer outer field subcoils being between 2.5 and 3.5 times greater than a number of turns in inner outer field subcoils of the subcoils, a radial thickness $(D_a-D_1)$ of the outer field subcoils being small compared to the mean diameter, $(D_a+D_1)/2$, thereof.

18. Magnet system according to claim 17 wherein the inner field coil comprises at least six subcoils the same winding density, arranged at axial distances from one another and through which, when viewed in the direction of the central axis of the magnet system, exciting current flows in the same direction, the inner field coils subcoils having a same inside diameter $d_1$, with a number of turns in middle inner field subcoils located between respective inner inner field subcoils and other inner field subcoils being between 1.3 and 1.6 times greater than a number in the inner inner field subcoils, and the number of turns in the outer inner field subcoils being between 3.5 and 4 times greater than the number in the inner inner field subcoils, a radial thicknesses $(d_{a2}-d_{a1})$ of the inner and middle inner field subcoils and a radial thicknesses $(da_a-d_1)$ of the outer inner field subcoils being between 4 and 6%, and 5 and 7%, respectively, of the inside diameter $(d_1)$ a length $L_1$ of the inner field coil, measured between outer ends of the outer inner field subcoils, is between 85 and 95% of a correspondingly measured length $L_a$, measured between outer ends of the outer outer field subcoils, of the outer field coil, an inside diameter $D_1$ of the outer field coil corresponds to between 90 and 95% of the axial length $L_a$ of the outer field coil, and a ratio $D_1/d_1$ between the inside diameter $D_1$ of the outer field coil and the inside diameter $d_1$ of the inner field coil is equal to approximately 1.4.

19. Magnet system according to claim 14 wherein the switching network comprises four superconducting electrical current paths, which can be switched, by heating, into a resistive state for blocking superconductivity current, such that each of two connections of the outer field coil system can be connected to and blocked off from each of two connections of the inner field coil system.

20. Magnet system according to claim 19 wherein the switching network is configured so that during energization, only one of the two superconducting current paths, by means of which the two field coils are connected in series with one another, is open in each case, and, as soon as the reference current density is reached, the current path which bypasses the energizing unit and closes the circuit to the field coils, connected in series, is switched into the superconducting state, and thereafter the other two current paths are also switched to superconducting transmission.

* * * * *